US009257501B2

(12) United States Patent
Takaya et al.

(10) Patent No.: US 9,257,501 B2
(45) Date of Patent: Feb. 9, 2016

(54) SEMICONDUCTOR DEVICE

(71) Applicants: Hidefumi Takaya, Miyoshi (JP); Masaru Nagao, Yatomi (JP); Narumasa Soejima, Seto (JP)

(72) Inventors: Hidefumi Takaya, Miyoshi (JP); Masaru Nagao, Yatomi (JP); Narumasa Soejima, Seto (JP)

(73) Assignee: Toyota Jidosha Kabushiki Kaisha, Toyota-shi (JP)

( * ) Notice: Subject to any disclaimer, the term of this patent is extended or adjusted under 35 U.S.C. 154(b) by 0 days.

(21) Appl. No.: 14/138,270

(22) Filed: Dec. 23, 2013

(65) Prior Publication Data

US 2014/0183620 A1    Jul. 3, 2014

(30) Foreign Application Priority Data

Dec. 28, 2012  (JP) ................................. 2012-287323

(51) Int. Cl.
| | |
|---|---|
| *H01L 29/06* | (2006.01) |
| *H01L 29/78* | (2006.01) |
| *H01L 29/16* | (2006.01) |
| *H01L 29/423* | (2006.01) |
| *H01L 29/739* | (2006.01) |

(52) U.S. Cl.
CPC ........ *H01L 29/0623* (2013.01); *H01L 29/0649* (2013.01); *H01L 29/0661* (2013.01); *H01L 29/4238* (2013.01); *H01L 29/42372* (2013.01); *H01L 29/7811* (2013.01); *H01L 29/7813* (2013.01); *H01L 29/1608* (2013.01); *H01L 29/42368* (2013.01); *H01L 29/7397* (2013.01)

(58) Field of Classification Search
CPC ............ H01L 29/7811; H01L 29/4238; H01L 29/4236; H01L 29/0623; H01L 29/0649; H01L 29/0661

USPC .................................. 257/328, E29.257, 330
See application file for complete search history.

(56) References Cited

U.S. PATENT DOCUMENTS

| | | | | |
|---|---|---|---|---|
| 2006/0214212 | A1* | 9/2006 | Horita et al. | 257/300 |
| 2007/0241394 | A1* | 10/2007 | Takaya et al. | 257/330 |
| 2007/0262390 | A1* | 11/2007 | Ishida et al. | 257/368 |
| 2008/0087951 | A1* | 4/2008 | Takaya et al. | 257/334 |
| 2012/0049187 | A1 | 3/2012 | Haruyama et al. | |

FOREIGN PATENT DOCUMENTS

| | | |
|---|---|---|
| JP | 2009-004655 A | 1/2009 |
| JP | 2009-004707 A | 1/2009 |
| JP | 2011-086746 A | 4/2011 |
| JP | 2012-054378 A | 3/2012 |

* cited by examiner

*Primary Examiner* — Brett Feeney
*Assistant Examiner* — Sarah Salerno
(74) *Attorney, Agent, or Firm* — Dinsmore & Shohl LLP (57) ABSTRACT

A semiconductor substrate of a semiconductor device includes a first conductive body region that is formed in the element region; a second conductive drift region that is formed in the element region; a gate electrode that is formed in the element region, that is arranged in a gate trench, and that faces the body region; an insulating body that is formed in the element region and is arranged between the gate electrode and an inside wall of the gate trench; a first conductive floating region that is formed in the element region and that is surrounded by the drift region; a first voltage-resistance retaining structure that is formed in the peripheral region and that surrounds the element region; and a gate pad that is formed in the peripheral region, and is electrically connected to the gate electrode in a position on the element region-side of the first voltage-resistance retaining structure.

5 Claims, 5 Drawing Sheets

FIG. 5

SEMICONDUCTOR DEVICE

INCORPORATION BY REFERENCE

The disclosure of Japanese Patent Application No. 2012-287323 filed on Dec. 28, 2012 including the specification, drawings and abstract is incorporated herein by reference in its entirety.

BACKGROUND OF THE INVENTION

1. Field of the Invention

The invention relates to a semiconductor device.

2. Description of Related Art

Japanese Patent Application Publication No. 2011-86746 (JP 2011-86746 A) describes a semiconductor device in which a gate pad is formed in a non-active region. In this semiconductor device, an element region and a termination region are formed in an active region. A plurality of linear trench gate electrodes are formed in the element region, and a plurality of termination trenches that encircle the plurality of trench gate electrodes are formed in the termination region. That is, the gate pad is arranged on an outer portion of the termination trench that is farthest to the outside. A p-type floating diffusion layer is formed on a bottom portion of gate trenches and a bottom portion of the termination trenches. The p-type floating diffusion layer is surrounded by an n-type drift region. In this semiconductor device, voltage resistance is retained by a PN junction of the p-type floating diffusion layer and the n-type drift diode formed on the bottom portion of the trenches, and a PN junction of a p-type body region and an n-type drift region.

With the semiconductor device described in JP 2011-86746 A, a gate pad is arranged to an outside of a voltage-resistance retaining structure formed in the termination region. That is, a gate pad is arranged to the outside of the voltage-resistance retaining structure. Therefore, when the voltage applied to the semiconductor device increases, high voltage is applied to the gate pad when there is a reverse bias, so the gate pad may become damaged.

SUMMARY OF THE INVENTION

The invention thus provides technology capable of inhibiting a gate pad from becoming damaged even if high voltage is applied to a semiconductor device.

A first aspect of the invention relates to a semiconductor device that includes a semiconductor substrate that is divided into at least an element region and a peripheral region that surrounds the element region. The semiconductor substrate includes (i) a first conductive type body region that is formed in the element region and is arranged in an area facing an upper surface of the semiconductor substrate; (ii) a second conductive type drift region that is formed in the element region and contacts a lower surface of the body region; (iii) a gate electrode that is formed in the element region, and that is arranged in a gate trench that passes through the body region and extends to the drift region, and that faces the body region; (iv) an insulating body that is formed in the element region and is arranged between the gate electrode and an inside wall of the gate trench; (v) a first conductive type floating region that is formed in the element region, and that surrounds a bottom portion of the gate trench, and that is surrounded by the drift region; (vi) a first voltage-resistance retaining structure that is formed in the peripheral region and that surrounds the element region; and (vii) a gate pad that is formed in the peripheral region, and is electrically connected to the gate electrode in a position on the element region-side of the first voltage-resistance retaining structure, on a front surface side of the semiconductor substrate.

When a reverse bias voltage is applied to the semiconductor device, voltage resistance is retained at two locations, i.e., the first conductive type body region and the first conductive type floating region. According to this structure, a high reverse bias voltage is able to be applied to the semiconductor device. Typically when a reverse bias voltage is applied to a semiconductor device, an end portion side of the front surface of the semiconductor substrate comes to have a higher potential than the element region side. In this semiconductor device, the first voltage-resistance retaining structure is formed to the outside of the gate pad (i.e., on the end portion side of the semiconductor substrate). Therefore, even if a high reverse bias voltage is applied to the semiconductor device, the electrical field will be reduced by the first voltage-resistance retaining structure, so the voltage that is applied to the gate pad will be less. Accordingly, the gate pad is able to be inhibited from becoming damaged even if a high reverse bias voltage is applied to the semiconductor device.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Hereinafter, the main characteristics of the example embodiments described below will be listed. The technical elements described below are all independent technical elements that display technical utility both alone and in various combinations, and are not limited to the combinations in the example embodiments.

Characteristic 1

The semiconductor device may have a second voltage-resistance retaining structure formed in a peripheral region. This second voltage-resistance retaining structure may be formed surrounding the element region, on an element region-side of a first voltage-resistance retaining structure. A gate pad may be arranged in a position on the first voltage-resistance retaining structure-side of a boundary on the element region-side of the second voltage-resistance retaining structure, on a front surface side of the semiconductor substrate. That is, the second voltage-resistance retaining structure is formed farther to the inside than the gate pad (also including below the gate pad). According to this structure, the electrical field is able to be slowly reduced by the second voltage-resistance retaining structure, and a reduction in voltage resistance is able to be inhibited.

Characteristic 2

In the semiconductor device, the first voltage-resistance retaining structure and the second voltage-resistance retaining structure may each have at least one termination trench that extends in a thickness direction of the semiconductor substrate from a front surface of the semiconductor substrate. According to this structure, when a high reverse bias voltage is applied to the semiconductor device, the electrical field is reduced by the termination trench of the first voltage-resistance retaining structure, and the voltage applied to the gate pad is reduced. Therefore, even if a high reverse bias voltage is applied to the semiconductor device, the gate pad is able to be inhibited from becoming damaged. Also, the electrical field also decreases due to the termination trench of the second voltage-resistance retaining structure, so a decrease in voltage resistance is able to be inhibited.

Characteristic 3

The semiconductor device may also have a first conductive type body region that is arranged in an area facing an upper surface of the semiconductor substrate, and a second conductive type drift region that contacts a lower surface of the body region, formed in the peripheral region. The termination trench may also pass through the body region and extend to the drift region. A first conductive type floating region that surrounds a bottom portion of the at least one termination trench and is surrounded by a drift region may also be formed in the peripheral region. When reverse bias voltage is applied to the semiconductor device, voltage resistance is retained at two locations, i.e., the first conductive type body region and the first conductive type floating region, in the termination trench in which the first conductive type floating region is formed, and voltage resistance is retained in the first conductive type body region, in the termination trench in which the first conductive type floating region is not formed. According to this structure, voltage resistance is able to be appropriately retained, and the electrical field is reduced by the termination trench to the outside of the gate pad, thus enabling the voltage applied to the gate pad to be reduced. That is, damage to the gate pad is able to be inhibited.

Characteristic 4

The semiconductor device may also be provided with a semiconductor substrate that is made of SiC. Typically, semiconductor substrates made of SiC are often used in high voltage environments. With the semiconductor device described in this specification, voltage resistance is able to be appropriately retained in an environment in which a high reverse bias voltage is applied.

Figure 1:
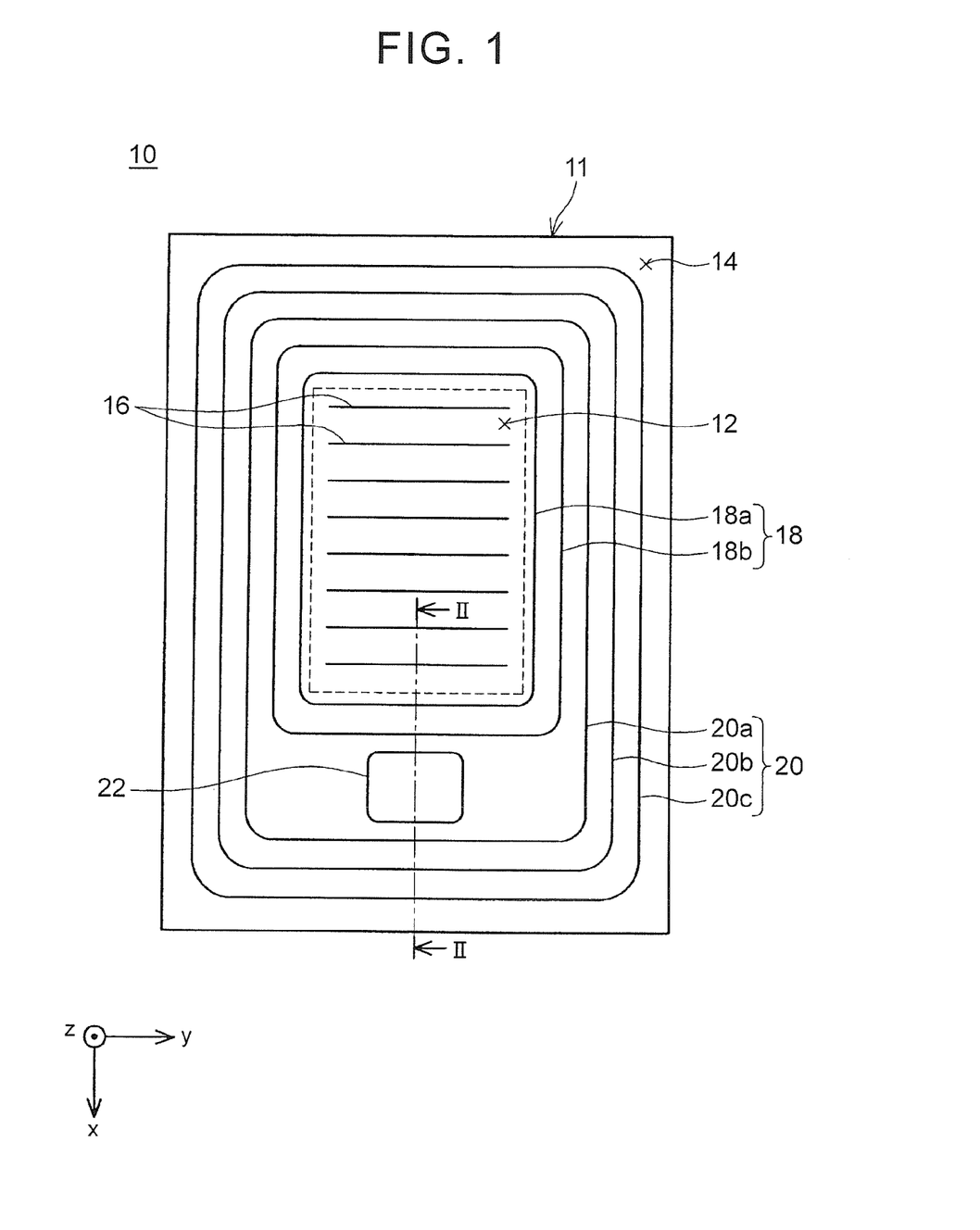
FIG. 1 is a plan view of a semiconductor device according to one example embodiment of the invention.

A semiconductor device 10 according to one example embodiment of the invention will now be described with reference to the accompanying drawings. As shown in FIG. 1, the semiconductor device 10 is formed with a semiconductor substrate 11. An element region 12 and a peripheral region 14 are formed on the semiconductor substrate 11. A well-known semiconductor substrate (such as a Si substrate or a SiC substrate, for example) may be used as the semiconductor substrate 11.

A plurality of gate electrodes 16 are formed in the element region 12. The plurality of gate electrodes 16 are arranged extending in a y-direction in FIG. 1 and are lined up apart from each other in an x-direction in FIG. 1. Two second termination trenches 18 (18a and 18b) and three first termination trenches 20 (20a to 20c) are formed in the peripheral region 14. The second termination trenches 18 encircle the periphery of the element region 12. The first termination trenches 20 encircle the periphery of the second termination trenches 18. A gate pad 22 is arranged, via an insulating layer 42 and an insulating film 44 that will be described later, on an upper surface of the semiconductor substrate 11. The gate pad 22 is arranged between the second termination trench 18b that is the outermost trench of the second termination trenches 18, and the first termination trench 20a that is the innermost trench of the first termination trenches 20. The gate pad 22 will be described in detail later. The first termination trenches 20 correspond to one example of a first voltage-resistance retaining structure, and the second termination trenches 18 correspond to one example of a second voltage-resistance retaining structure. Hereinafter, the gate electrodes 16 and termination trenches 18 and 20, as well as other portions that are provided in plurality, may be referred to in the singular to facilitate understanding.

Figure 2:
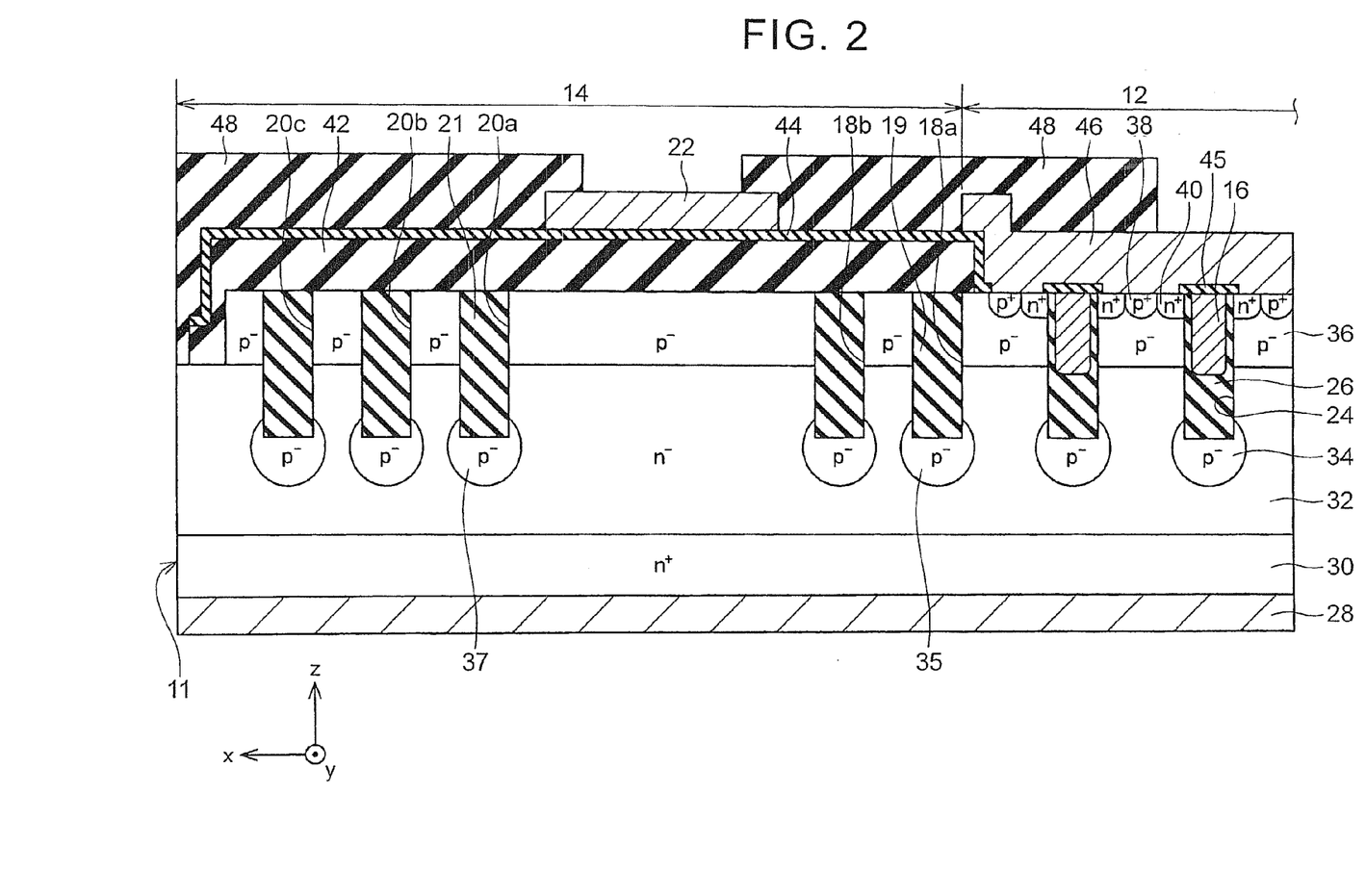
FIG. 2 is a longitudinal sectional view taken along line II-II in FIG. 1.

Here, the structure of the element region 12 will be described. As shown in FIG. 2, an insulated gate type semiconductor element is formed in the element region 12. That is, an $n^+$-type source region 40 and a $p^+$-type body contact region 38 are formed in a region facing the upper surface of the semiconductor substrate 11, in the element region 12. The body contact region 38 is formed contacting the source region 40.

A $p^-$-type body region 36 is formed on a lower side of the source region 40 and the body contact region 38. An impurity concentration of the body region 36 is lower than an impurity concentration of the body contact region 38. The body region 36 contacts the source region 40 and the body contact region 38. Therefore, the source region 40 is surrounded by the body region 36 and the body contact region 38. The body region 36 is formed to the outer side of the first termination trench 20c that is positioned farthest to the outside in the peripheral region 14. The $p^-$-type body region 36 corresponds to one example of the first conductive type body region.

An $n^-$-type drift region 32 is formed on a lower side of the body region 36. The drift region 32 is formed over the entire surface of the semiconductor substrate 11. The drift region 32 contacts a lower surface of the body region 36. The drift region 32 is separated from the source region 40 by the body region 36. A $p^-$-type diffusion region 34 is formed in an area surrounding a bottom portion of a gate trench 24 that will be described later, in the drift region 32. The diffusion region 34 contacts an insulating body 26 below the gate electrode 16 (i.e., the bottom portion of the gate trench 24). The diffusion region 34 is surrounded by the drift region 32. Therefore, the diffusion region 34 is separated from the body region 36. The $n^-$-type drift region 32 corresponds to one example of the second conductive type drift region, and the $p^-$-type diffusion region 34 corresponds to one example of the first conductive type floating region.

An $n^+$-type drain region 30 is formed in an area facing the lower surface of the semiconductor substrate 11. The drain region 30 is formed over the entire surface of the semiconductor substrate 11. An impurity concentration of the drain region 30 is higher than an impurity concentration in the drift region 32. The drain region 30 contacts the lower surface of the drift region 32. The drain region 30 is separated from the body region 36 by the drift region 32.

The gate trench 24 is formed on the upper surface of the semiconductor substrate 11. The gate trench 24 passes through the source region 40 and the body region 36, and a lower end of the gate trench 24 extends to the drift region 32. The gate electrode 16 is formed in the gate trench 24. The gate electrode 16 is formed such that a lower end thereof is slightly deeper than the lower surface of the body region 36. The insulating body 26 is filled between a wall surface of the gate trench 24 and the gate electrode 16 (i.e., to the side of and below the gate electrode 16). Therefore, the gate electrode 16 opposes the body region 36 and the source region 40 via the insulating body 26. Also, a cap insulating film 45 is formed on an upper surface of the gate electrode 16.

A drain electrode 28 is formed on the lower surface of the semiconductor substrate 11. The drain electrode 28 is formed over the entire surface of the semiconductor substrate 11. The drain electrode 28 ohmically contacts the drain region 30. A source electrode 46 is formed on the upper surface of the semiconductor substrate 11. The source electrode 46 is formed in the element region 12. The source electrode 46 ohmically contacts the source region 40 and the body contact region 38. The source electrode 46 is insulated from the gate electrode 16 by the cap insulating film 45.

Next, the peripheral region 14 will be described. As shown in FIG. 2, the two second termination trenches 18 (18a and 18b) and the three first termination trenches 20 (20a to 20c) are formed in the peripheral region 14. The p$^-$-type body region 36, and the n$^-$-type drift region 32 that contacts the lower surface of the body region 36, are also formed in an area facing the upper surface of the semiconductor substrate 11, in the peripheral region 14. The second termination trench 18 passes through the body region 36 and a lower end of the second termination trench 18 extends to the drift region 32. The lower end of the second termination trench 18 is at the same depth as the lower end of the gate trench 24. An insulating body 19 is filled in the second termination trench 18. A p$^-$-type diffusion region 35 is formed in an area that includes the bottom portion of the second termination trench 18. The diffusion region 35 is surrounded by the drift region 32. The first termination trench 20 has a structure similar to that of the second termination trench 18. That is, the first termination trench 20 passes through the body region 36, and a lower end of the first termination trench 20 is at the same depth as the second termination trench 18. An insulating body 21 is filled inside the first termination trench 20. A p$^-$-type diffusion region 37 that is surrounded by the drift region 32 is formed on a bottom portion of the first termination trench 20. The p$^-$-type diffusion regions 35 and 37 correspond to one example of the first conductive type floating region.

The insulating layer 42 is formed on the upper surface of the semiconductor substrate 11 of the peripheral region 14, so as to cover the second termination trenches 18 and the first termination trenches 20. The insulating layer 42 covers an end portion (a side surface) of the semiconductor substrate 11 in the body region 36. Therefore, the end portion of the body region 36 is not exposed. The insulating film 44 is formed on the upper surface of the insulating layer 42, so as to cover the insulating layer 42. That is, the insulating film 44 covers a portion of the side surface, and the upper surface of the insulating layer 42. The gate pad 22 is arranged on an upper surface of the insulating film 44, between the second termination trench 18b that is the outermost trench of the second termination trenches 18, and the first termination trench 20a that is the innermost trench of the first termination trenches 20 (that is, the termination trench on the element region-side, among the first termination trenches 20). As shown in FIG. 1, the gate pad 22 has a rectangular shape and is arranged in substantially the center of the semiconductor substrate 11 in the y-direction. The gate pad 22 is electrically connected to the gate electrode 16 by gate wiring, not shown. The gate wiring is connected to both ends of each gate electrode 16 in the longitudinal direction, for example. As long as the gate pad 22 is formed on the insulating film 44 and the gate electrode 16 at the opening of the cap insulating film 45 and the gate pad 22 are connected by the gate wiring, the arrangement of the gate wiring on the insulating film is not limited. For example, a part of the gate wiring between the gate electrode 16 on the element region 12 and the gate pad 22 may be provided outside the annular first termination trench 20. The entire gate wiring may be provided inside the annular first termination trench 20. One end of a wire, not shown, is bonded to the gate pad 22, and the gate pad 22 is connected to an external circuit by this wire. In this example embodiment, a termination trench is not formed below the gate pad 22 (i.e., in the direction opposite the z-direction in FIG. 2), and a diffusion region that surrounds the termination trench bottom portion is also not formed there.

As shown in FIG. 1, the distance in the x-direction between the second termination trench 18a and the gate electrodes 16 (strictly speaking, the gate trench 24 that has the gate electrodes 16) positioned on both ends in the x-direction is substantially the same as the distance between the gate trenches 24 in the x-direction. Also, the distance between one side of the second termination trench 18b that is adjacent to the gate pad 22, and one side of the first termination trench 20a that is adjacent to the gate pad 22, is slightly wider than the length of the gate pad 22 in the x-direction. The distance between the second termination trenches 18 is substantially the same as the distance between the first termination trenches 20. The distance between the second termination trench 18b and the first termination trench 20a that are adjacent to each other, is substantially the same as the distance between the second termination trenches 18 (or the distance between the first termination trenches 20), except for the distance between the side of the second termination trench 18b and the side of the first termination trench 20a where the gate pad 22 is sandwiched in between the two.

As shown in FIG. 2, an insulating layer 48 is formed on the semiconductor substrate 11, so as to cover a portion of the source electrode 46, a portion of the insulating film 44, and a portion of the gate pad 22. The insulating layer 48 covers the end portion of the insulating layer 42, and the end portion of the insulating film 44.

When using the semiconductor device 10, the drain electrode 28 is connected to a power supply potential, and the source electrode 46 is connected to a ground potential. When the potential applied to the gate pad 22 is less than a threshold value potential, the semiconductor device 10 is off. When the semiconductor device 10 is off, the depletion layer expands from a PN junction of a boundary between the body region 36 and the drift region 32, and a PN junction of a boundary between the drift region 32 and the diffusion regions 34, 35, and 37.

When the potential applied to the gate pad 22 becomes equal to or greater than the threshold value potential, the semiconductor device 10 turns on. That is, in the element region 12, the potential applied to the gate pad 22 is applied from the gate wiring to both ends of the gate electrode 16. When the potential applied to the gate electrode 16 becomes equal to or greater than the threshold value potential, a channel forms in the body region 36 in an area contacting the insulating body 26. As a result, electrons flow from the source electrode 46 to the drain electrode 28, through the source region 40, the channel in the body region 36, the drift region 32, and the drain region 30. That is, current flows from the drain electrode 28 to the source electrode 46.

Next, the advantages of the semiconductor device 10 according to the example embodiment will be described referring to a semiconductor device according to related art as a comparative example, with reference to FIGS. 1 to 4. Members of the semiconductor device in the comparative example that are the same as members of the semiconductor device 10 in the example embodiment will be denoted by like reference characters, and detailed descriptions of these members will be omitted.

Figure 3:
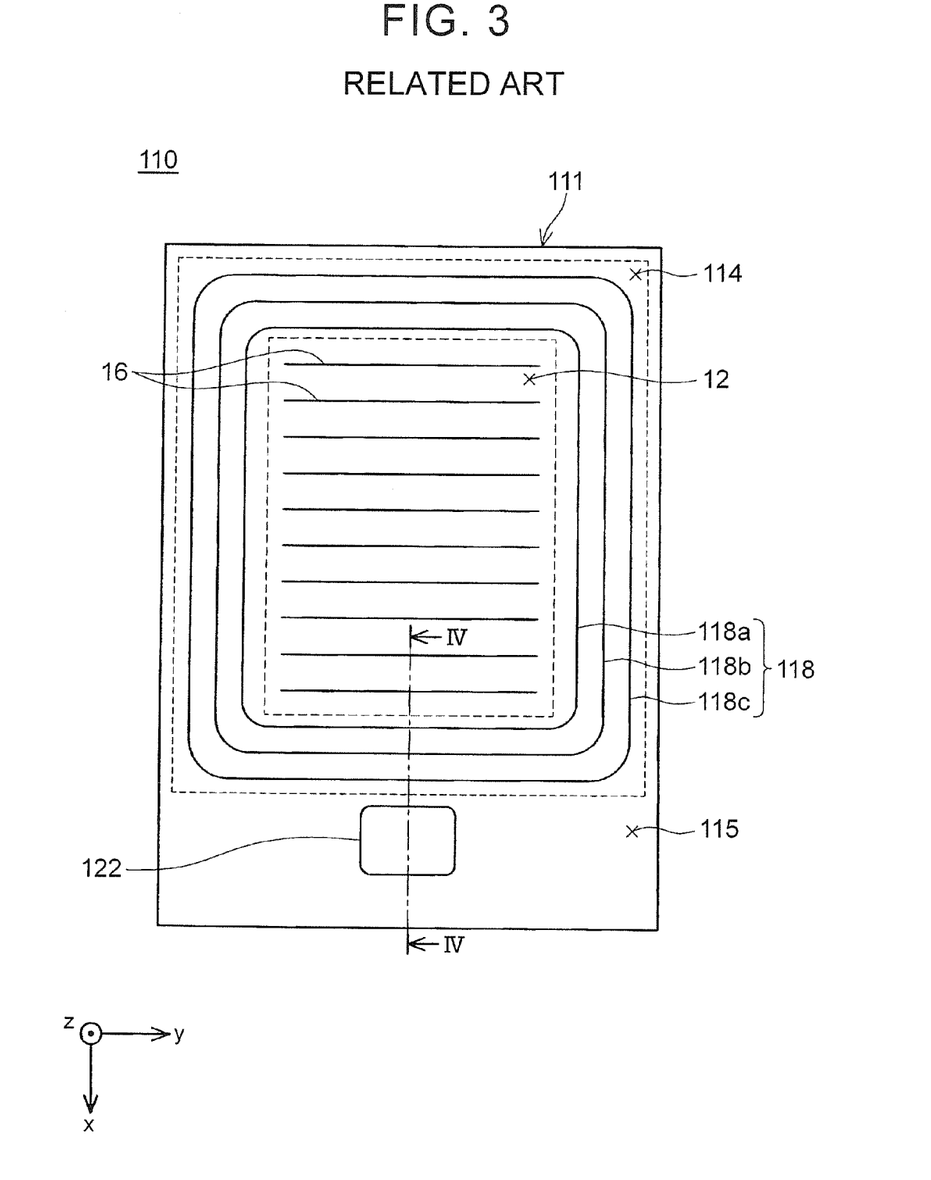
FIG. 3 is a plan view of a semiconductor device according to related art.

FIG. 3 is a plan view of a semiconductor device 110 according to the related art. As shown in FIG. 3, in the semiconductor device 110 of the related art, an element region 12, a first peripheral region 114, and a second peripheral region 115 are provided on a semiconductor substrate 111. Three termination trenches 118 (118a to 118c) are formed in the first peripheral region 114. Hereinafter, the termination trench 118 and other portions provided in plurality may be referred to in the singular to simplify the description. A gate pad 122 is arranged in the second peripheral region 115.

Figure 4:
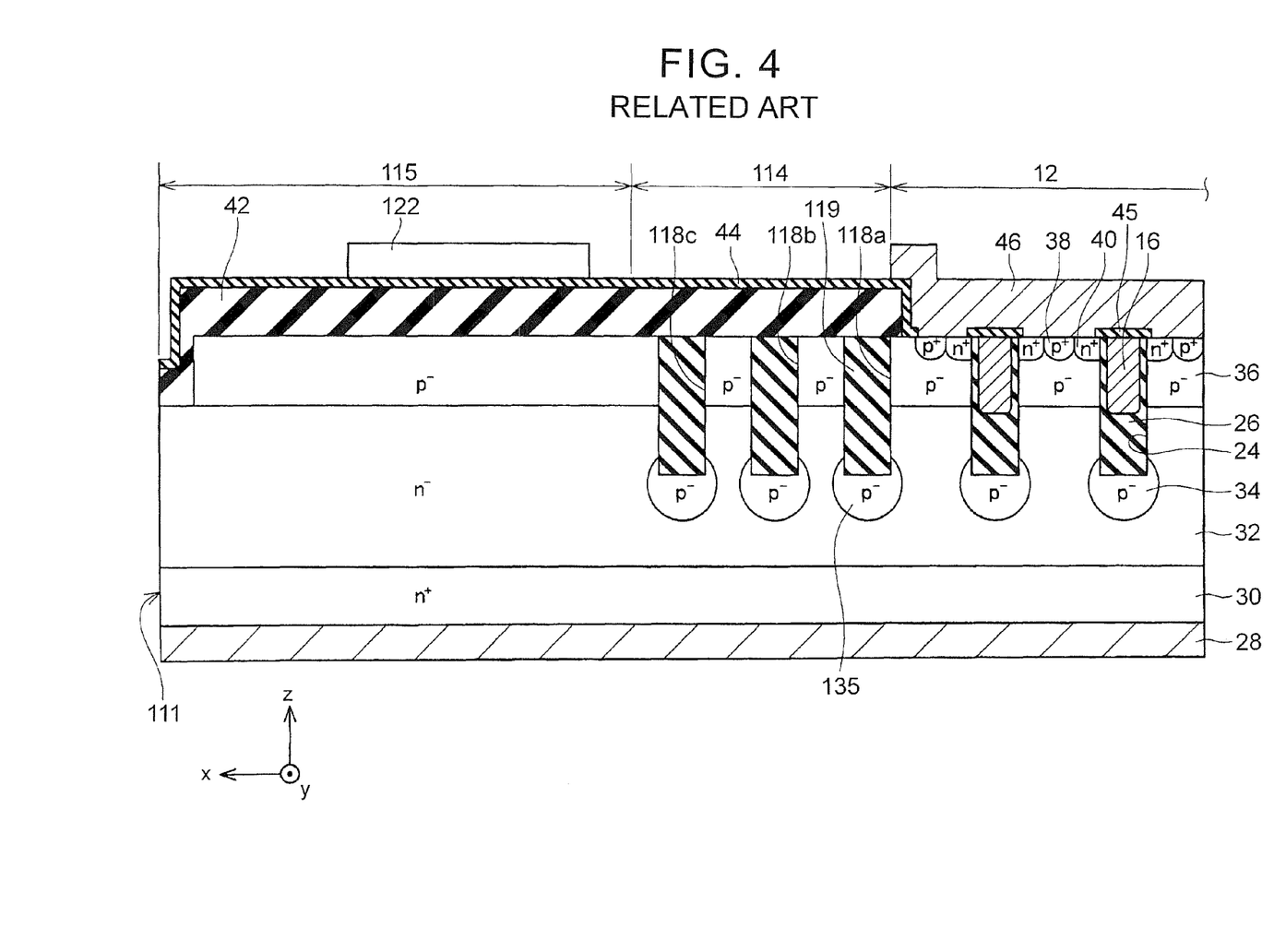
FIG. 4 is a longitudinal sectional view taken along line IV-IV in FIG. 3.

As shown in FIG. 4, the termination trench 118 passes through the body region 36, and a lower end of the termination trench 118 extends to the drift region 32. The lower end of the termination trench 118 is the same depth as the lower end of the gate trench 24. An insulating body 119 is filled inside the termination trench 118. A p⁻-type diffusion region 135 is formed in an area surrounding a bottom portion of the termination trench 118. The diffusion region 135 is surrounded by the drift region 32. That is, the second termination trench 118 of the semiconductor device 110 according to the related art has a structure similar to that of the second termination trench 18 (or the first termination trench 20) in the example embodiment.

With the semiconductor device 110 according to the related art, the gate pad 122 is arranged to the outside of the termination trench 118 (i.e., on an end portion side of the semiconductor substrate 111), as shown in FIGS. 3 and 4. Typically, when voltage in the reverse bias direction is applied to a semiconductor device, the end portion side of the semiconductor substrate comes to have a high potential. When the semiconductor substrate 111 is a SiC substrate or the like, for example, a high reverse bias voltage (such as 1200 V) is applied to the semiconductor device 110. In this case, the end portion of the semiconductor substrate 111 comes to have a high potential, so the insulating layer 42 and the insulating film 44 formed between the gate pad 122 and the semiconductor substrate 111 may be destroyed, and as a result, the gate pad 122 may become damaged.

However, with the semiconductor device 10 in the example embodiment, the first termination trenches 20 are formed to the outside of the gate pad 22, as shown in FIGS. 1 and 2. Therefore, even if a high reverse bias voltage of 1200 V, for example, is applied to the semiconductor device 10, the electrical field will be reduced by the first termination trenches 20, so the voltage that is applied to the gate pad 22 will decrease, thus enabling damage to the gate pad to be inhibited. Also, the second termination trenches 18 are formed surrounding the element region, on the element region-side of the gate pad 22. Therefore, voltage resistance is able to be retained without decreasing.

Also, as shown in FIG. 2, with the semiconductor device 10 in the example embodiment, the body region 36 that extends to the outside of the first termination trench 20c is formed in the peripheral region 14, and the diffusion region 37 is formed on the bottom portion of each first termination trench 20. Therefore, when a high reverse bias voltage is applied to the semiconductor device 10, the depletion layer expands from the PN junction at two locations (i.e., the PN junction at the boundary between the body region 36 and the drift region 32, and the PN junction at the boundary between the diffusion region 37 and the drift region 32), near the first termination trenches 20. Having the depletion layer formed over a broad area enables the voltage resistance of the semiconductor substrate end portion to be retained, and enables the electrical field to be reduced.

The voltage applied to the gate pad 22 is able to be reduced as the number of termination trenches that form the first termination trenches 20 increases. Therefore, the voltage applied to the gate pad 22 is able to be adjusted to a desired voltage by adjusting the number of first termination trenches 20. In this example embodiment, the strength of the electrical field is reduced to a strength at which voltage resistance is able to be retained by only the PN junction at the boundary between the body region 36 and the drift region 32, by the PN junctions at the two locations near the first termination trenches 20. Therefore, voltage resistance is able to be retained even without forming a termination trench (and a diffusion region formed on the termination trench bottom portion) below the gate pad 22. As a result, damage to the gate pad 22 is able to be inhibited. Also, the diffusion regions 35 and 34 are formed on the second termination trench 18 and the bottom portion of the gate trench 24, respectively. Also, as shown in FIG. 2, the distance between the second termination trench 18a and the gate trench 24 is substantially the same as the distance between the gate trenches 24. Therefore, even if a high reverse bias voltage is applied to the semiconductor device 10, voltage resistance in the longitudinal direction (i.e., the z-direction in FIG. 2) and the lateral direction (i.e., the x-y plane in FIG. 2) of the semiconductor device 10 is able to be retained without decreasing, by the PN junction at the boundary between the body region 36 and the drift region 32, and the PN junction at the boundary between the diffusion regions 35 and 34 and the drift region 32.

Modified Example

Figure 5:
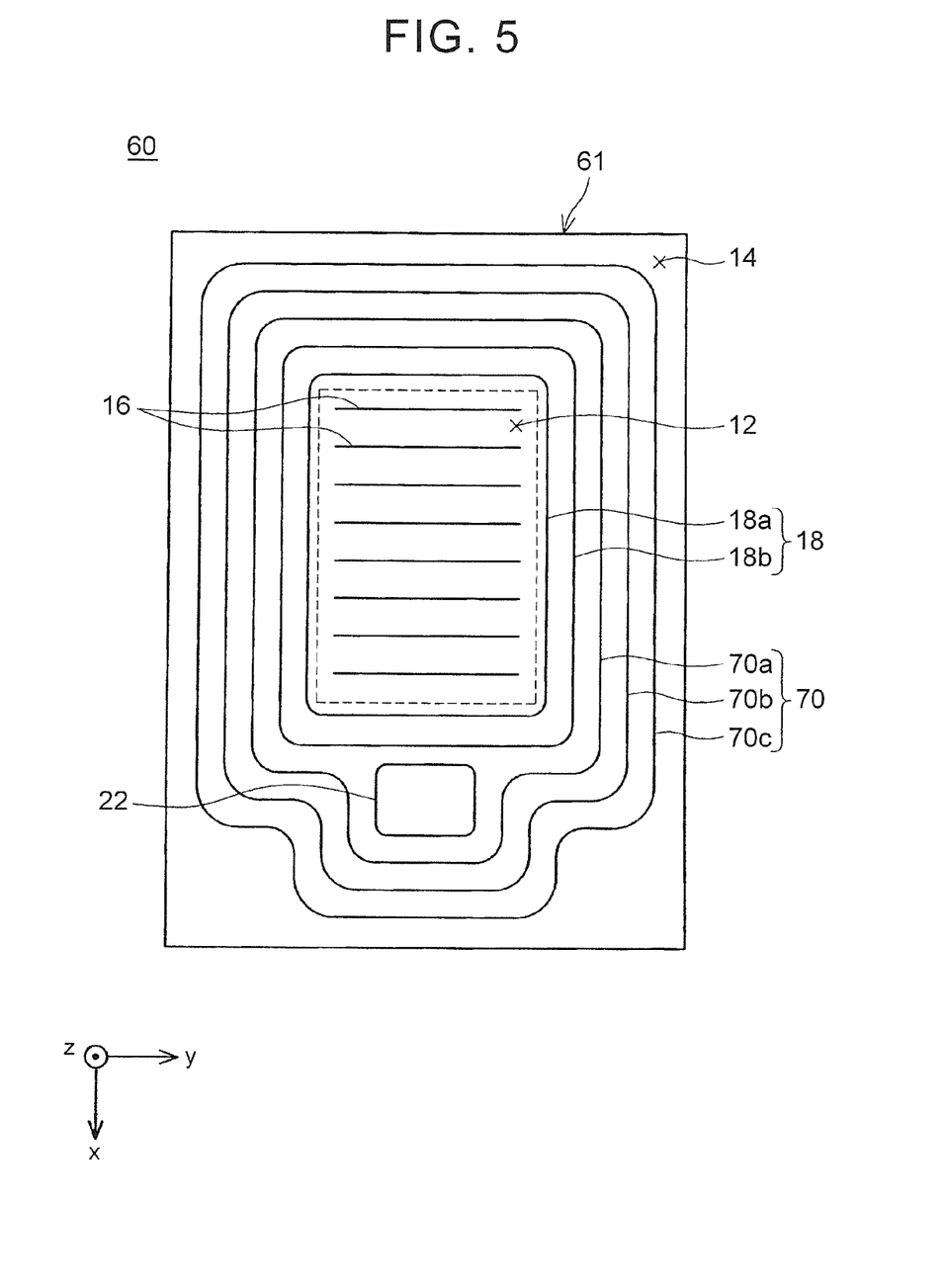
FIG. 5 is a plan view of a semiconductor device according to a modified example of the example embodiment.

Next, a modified example of the example embodiment will be described with reference to FIG. 5. Hereinafter, only differences from the example embodiment will be described, and detailed descriptions of structures that are the same as those in the example embodiment will be omitted.

In a semiconductor device 60 according to the modified example, the shapes of second termination trenches 70 when the semiconductor device 60 is viewed from above differ from the shapes of the first termination trenches 20 of the semiconductor device 10. That is, in the example embodiment, when the semiconductor device 10 is viewed from above, the side of the first termination trench 20a that is adjacent to the gate pad 22 is substantially parallel to the side of the second termination trench 18b that is adjacent to the gate pad 22. The distance between the two sides is slightly wider than the length of the gate pad 22 in the x-direction. That is, the shapes of the first termination trenches 20 are rectangular when viewed from above. On the other hand, in the modified example, the second termination trenches 70 are formed surrounding the second termination trenches 18 and the gate pad 22, in a manner following the outer periphery of the gate pad 22. That is, the distance between the second termination trench 18b and a second termination trench 70a is wide only at the location where the gate pad 22 is arranged. The same advantages as those of the example embodiment are able to be obtained with the second termination trenches 70 formed in this kind of layout as well. Furthermore, the portion where the distance between the second termination trench 18b and the second termination trench 70a is wide is less than it is in the semiconductor device 10 of the example embodiment, so voltage resistance is able to be even more reliably retained. Also, this layout also enables another region such as a sense region or the like to be formed in a space created in both a lower left portion and a lower right portion of a semiconductor substrate 61 in FIG. 5. The region on the semiconductor substrate is able to be effectively used without changing the size of the semiconductor substrate.

Heretofore, example embodiments have been described in detail, but the invention is not limited to these example embodiments. The example embodiments may also be changed or modified in a variety of ways. For example, the voltage-resistance retaining structures are not limited to a structure that uses a gate trench. That is, the voltage-resistance retaining structure may also be an FLR (Field Limiting Ring) or another voltage-resistance retaining structure. Also, the element structure formed in the element region 12 is not limited to a MOS, and may also be a diode or a switching element such as an IGBT. Also, in the example embodiments described above, the gate pad 22 is arranged to the outside of the second termination trench 18b that is the outermost trench of the second termination trenches 18, but at least a portion of the gate pad 22 may also be arranged above the second termination trenches 18. That is, the gate pad 22 need simply be arranged between the second termination trench 18a that is the innermost trench of the second termination trenches 18, and the first termination trench 20a that is the innermost trench of the first termination trenches 20. Further, as long as voltage resistance is able to be retained, the diffusion region 35 does not have to be formed on the bottom portion of all of the second termination trenches 18. The same also applies to the diffusion region 37 on the bottom portion of the first termination trenches 20. Also, the gate pad 22 may be arranged in a position other than substantially the center in the y-direction in FIG. 1. When "n-type" is able to be regarded as the first conductive type, "p-type" may be regarded as the second conductive type.

Also, the technical elements illustrated in the specification and the drawings display technical utility both alone and in various combinations. Further, the technology illustrated in the specification and the drawings simultaneously achieves a plurality of objects, and has technical utility by simply achieving one of these objects.

What is claimed is:

1. A semiconductor device comprising:
  a semiconductor substrate that is divided into at least an element region and a peripheral region that surrounds the element region, the semiconductor substrate including
  (i) a first conductive type body region that is formed in the element region and is arranged in an area facing an upper surface of the semiconductor substrate;
  (ii) a second conductive type drift region that is formed in the element region and contacts a lower surface of the first conductive type body region;
  (iii) a gate electrode that is formed in the element region, and that is arranged in a gate trench that passes through the first conductive type body region and extends to the second conductive type drift region, and that faces the first conductive type body region;
  (iv) an insulating body that is formed in the element region and is arranged between the gate electrode and an inside wall of the gate trench;
  (v) a first conductive type floating region that is formed in the element region, and that surrounds a bottom portion of the gate trench, and that is surrounded by the second conductive type drift region;
  (vi) a first voltage-resistance retaining structure that is formed in the peripheral region and that surrounds the element region, the first voltage-resistance retaining structure has a first termination trench that extends in a thickness direction of the semiconductor substrate from a front surface of the semiconductor substrate;
  (vii) a second voltage-resistance retaining structure formed in the peripheral region, the second voltage-resistance retaining structure surrounds the gate electrode, the second voltage-resistance retaining structure is surrounded by the first voltage-resistance retaining structure, the second voltage-resistance retaining structure has a second termination trench that extends in the thickness direction of the semiconductor substrate from the front surface of the semiconductor substrate; and
  (viii) a gate pad that is formed in the peripheral region, and the gate pad is electrically connected to the gate electrode in a position on an element region-side of the first voltage-resistance retaining structure, on a front surface side of the semiconductor substrate, the gate pad is only surrounded by the first voltage-resistance retaining structure from among the first voltage-resistance retaining structure and the second voltage-resistance retaining structure.

2. The semiconductor device according to claim 1, wherein
  the second voltage-resistance retaining structure is formed surrounding the element region, on the element region-side of the first voltage-resistance retaining structure; and
  the gate pad is arranged in a position on a first voltage-resistance retaining structure-side of a boundary on the element region-side of the second voltage-resistance retaining structure, on the front surface side of the semiconductor substrate.

3. The semiconductor device according to claim 1, wherein
  the peripheral region includes the first conductive type body region, and the second conductive type drift region;
  the first termination trench and the second termination trench passes through the first conductive type body region and extends to the second conductive type drift region; and
  a first conductive type floating region surrounds a bottom portion of at least one of the first termination trench and the second termination trench, the first conductive type floating region is surrounded by the second conductive type drift region, the first conductive type floating region is also formed in the peripheral region.

4. The semiconductor device according to claim 1, wherein the semiconductor substrate is made of SiC.

5. The semiconductor device according to claim 1, further comprising an insulating layer formed between the gate pad and the first conductive type body region.

* * * * *